(12) United States Patent
Inoue et al.

(10) Patent No.: US 7,898,636 B2
(45) Date of Patent: Mar. 1, 2011

(54) CLAY THIN FILM SUBSTRATE, CLAY THIN FILM SUBSTRATE WITH ELECTRODE, AND DISPLAY DEVICE USING THE SAME

(75) Inventors: Tomohito Inoue, Shizuoka (JP); Hajime Tsuda, Shizuoka (JP); Katsumi Motegi, Shizuoka (JP); Takeo Ebina, Sendai (JP); Fujio Mizukami, Tagajo (JP)

(73) Assignees: Tomoegawa Co., Ltd., Tokyo (JP); National Institute of Advanced Science and Technology, Tokyo (JP)

( * ) Notice: Subject to any disclaimer, the term of this patent is extended or adjusted under 35 U.S.C. 154(b) by 426 days.

(21) Appl. No.: 12/067,666

(22) PCT Filed: Sep. 19, 2006

(86) PCT No.: PCT/JP2006/318496
§ 371 (c)(1),
(2), (4) Date: Mar. 21, 2008

(87) PCT Pub. No.: WO2007/034775
PCT Pub. Date: Mar. 29, 2007

(65) Prior Publication Data
US 2009/0141230 A1    Jun. 4, 2009

(30) Foreign Application Priority Data

Sep. 22, 2005  (JP) ................................ 2005-275534
Mar. 6, 2006   (JP) ................................ 2006-059933

(51) Int. Cl.
*G02F 1/1333*   (2006.01)
*C09K 19/00*    (2006.01)
*H01J 1/62*     (2006.01)

(52) U.S. Cl. ......... 349/158; 349/160; 428/1.6; 428/1.62; 313/505

(58) Field of Classification Search .................. 349/158, 349/160; 428/1.6, 1.62; 313/505
See application file for complete search history.

(56) References Cited

U.S. PATENT DOCUMENTS 7,560,168 B2 *  7/2009  Tanaka et al. ................. 428/500
7,799,395 B2 *  9/2010  Ebina et al. .................. 428/35.1

FOREIGN PATENT DOCUMENTS

| JP | 2002-255188 A | 9/2002 |
| JP | 2003-191371   | 7/2003 |
| JP | 2003-262854 A | 9/2003 |
| JP | 2003-291251 A | 10/2003 |
| JP | 2004-114645 A | 4/2004 |
| JP | 2004-230625 A | 8/2004 |

(Continued)

OTHER PUBLICATIONS

Japanese Patent Office, International Search Report and Written Opinon in International Patent Application No. PCT/JP2006/318496 dated Dec. 26, 2006.

(Continued)

*Primary Examiner* — Mike Qi
(74) *Attorney, Agent, or Firm* — Wood, Herron & Evans, LLP

(57) ABSTRACT

A clay thin film substrate including a clay thin film having a structure, in which oriented clay particles are laminated; and at least a gas barrier inorganic layer which is laminated on at least one surface of the clay thin film.

17 Claims, 2 Drawing Sheets

FOREIGN PATENT DOCUMENTS

| | | |
|---|---|---|
| JP | 2005-096322 A | 4/2005 |
| JP | 2005-111702 A | 4/2005 |
| JP | 2005-212229 A | 8/2005 |
| JP | 2005-251500 A | 9/2005 |
| JP | 2007-522343 T | 8/2007 |
| JP | 2005-111702 A | 3/2008 |
| WO | 2005/023714 A1 | 3/2005 |
| WO | 2005-073427 A2 | 8/2005 |

OTHER PUBLICATIONS

Japanese Patent Office; Office Action in Japanese Patent Application No. 2006-059933 mailed on Dec. 14, 2010.

Japanese Patent Office; Office Action in Japanese Patent Application No. 2005-275534 mailed on Dec. 14, 2010.

* cited by examiner

CLAY THIN FILM SUBSTRATE, CLAY THIN FILM SUBSTRATE WITH ELECTRODE, AND DISPLAY DEVICE USING THE SAME

TECHNICAL FIELD

The present invention relates to a clay thin film substrate having a structure, in which a inorganic layer is laminated on a clay thin film, a clay thin film substrate with an electrode for a display device, and a display device using them.

BACKGROUND ART

Conventional cathode ray tube displays are rapidly being replaced by liquid crystal displays (LCD) due to their mobility and compact size. Furthermore, as a next-generation display, organic electroluminescence (EL) displays that are self-luminous and are excellent in terms of luminosity, brightness, and power consumption are now being produced. Although these displays are excellent compared to the conventional cathode ray tube displays in terms of their mobility and compact size, they are relatively heavy and also break easily, which are their disadvantages, because glass is used as their substrate.

In order to solve these problems, a film substrate (which is called "placell") is used in some liquid crystal displays. However, for those driven by a thin film transistor (TFT) that are currently mainstream and are capable of dealing with moving images, there are no film substrates available for practical use.

The reason for this is because there is no film substrate, which can resist the temperature for forming a TFT circuit and is also highly transparent. In the case of organic EL displays which are receiving much attention as a next-generation displays, considerably high oxygen barrier performance is also required in addition to the abovementioned characteristics in order to protect organic EL devices.

Clay thin films are attracting attention as a material that may satisfy these requirements. Clay thin films have excellent flexibility, and since they have a structure where clay particles are densely oriented in layers, they are materials with excellent gas barrier properties along with excellent heat resistance and nonflamability (refer to Patent Document 1). However, there are several problems associated with them when used as a film substrate for liquid crystal and organic EL displays.

One of the problems is surface flatness. By taking organic EL displays as an example, when the surface of a substrate is not flat, a transparent conductive film cannot be formed uniformly causing reduction in electrical conductivity at the defective parts. Furthermore, the organic EL device may also be damaged. Since the transparent conducting oxide and organic EL devices are formed of thin-film layers that are extremely thin and range from a few tens to a few hundreds of nanometers, their substrates are required to have low surface roughness of a few to a few tens of nanometers in order to prevent this problem. However, conventional clay thin films cannot satisfy this requirement. The reason for this lies in the production method thereof. Conventionally, clay thin films are prepared by allowing a clay dispersion, which is dispersed in a dispersion medium having water as a main component, to stand horizontally in order to slowly deposit clay particles as well as to evaporate the dispersion medium. In such a case, it is currently difficult to suppress values of surface roughness Ra down to a submicron range or less since the film surface is formed naturally.

Another problem of the conventional clay thin films is a problem of their water vapor barrier properties. Since clay is a hydrophilic material, it is hygroscopic and has a property to easily permeate water vapor. When clay thin films contain a large amount of water vapor, the densely layered and oriented structure of clay particles in the clay thin films is destroyed, and thus gas barrier properties of the clay thin films are impaired while their heat resistance and mechanical strength are also reduced. Since this problem originates from the nature of clay itself, it is difficult to improve.

[Patent Document 1]
Japanese Laid-Open Patent Application No. 2005-104133

DISCLOSURE OF INVENTION

Problems to be Solved by the Invention

As described above, in order to use a clay thin film having excellent gas barrier properties, heat resistance, nonflamability, transparency, and flexibility as a film substrate for liquid crystal and organic EL displays, its surface flatness and water vapor barrier properties need to be improved greatly. Accordingly, the object of the present invention is to give these properties to clay thin films and to provide a clay thin film substrate that can be used as a film substrate for organic EL displays. Another object of the present invention is to provide a display device that uses such a clay thin film substrate.

Means for Solving the Problems

A first aspect of the clay thin film substrate of the present invention is characterized in that a gas barrier inorganic layer is laminated on at least one surface of the clay thin film, which has a structure where oriented clay particles are laminated.

A second aspect of the clay thin film substrate of the present invention is characterized in that a planarized inorganic layer is laminated on at least one surface of the clay thin film, which has a structure where oriented clay particles are laminated, and that a gas barrier inorganic layer is laminated on the planarized inorganic layer.

A third aspect of the clay thin film substrate of the present invention is characterized in that a plurality of gas barrier inorganic layers and a plurality of planarized inorganic layers are laminated alternately on at least one surface of the clay thin film, which has a structure where oriented clay particles are laminated.

A fourth aspect of the clay thin film substrate of the present invention is characterized in that an organic polymer layer and a gas barrier inorganic layer are laminated on at least one surface of the clay thin film, which has a structure where oriented clay particles are laminated.

A fifth aspect of the clay thin film substrate of the present invention is characterized in that a plurality of organic polymer layers and a plurality of gas barrier inorganic layers are laminated alternately on at least one surface of the clay thin film, which has a structure where oriented clay particles are laminated.

The gas barrier inorganic layers in the clay thin film substrates of the abovementioned first to fifth aspects of the present invention is formed of a silicon oxide film that contains nitrogen or a silicon nitride film and its film thickness is preferably 10 to 200 nm. The gas barrier inorganic layer can be formed by a sputtering method.

The planarized inorganic layer in the clay thin film substrates of the abovementioned second and third aspects of the present invention are formed of a silicon oxide film that contains carbon and its film thickness is preferably 100 to 5000 nm. The planarized inorganic layer can be formed by a chemical vapor deposition (CVD) method.

The clay thin film substrate with an electrode of the present invention is characterized in that a transparent conductive layer is laminated on any one of the surfaces of the clay thin film substrates of the abovementioned first to fifth aspects. In the clay thin film substrate with an electrode, an anti-glare layer may be provided on the surface opposite to the surface where the transparent conductive layer is laminated. Moreover, an antireflection layer may be provided on the surface opposite to the surface where the transparent conductive layer is laminated. Furthermore, a hard coat layer may be provided on the surface opposite to the surface where the transparent conductive layer is laminated.

A first aspect of the display device of the present invention is an electroluminescence display device, which has a laminated body where at least a transparent electrode layer, a light emitting layer, and a cathode layer are sequentially laminated on a substrate, and characterized in that the clay thin film substrate of the abovementioned first to fifth aspects is used as the substrate.

A second aspect of the display device of the present invention is a liquid crystal display device where liquid crystal is sandwiched between two substrates, on which at least an electrode layer is laminated, and is characterized in that the clay thin film substrate of the abovementioned first to fifth aspects is used as the substrate.

EFFECTS OF THE INVENTION

Since a gas barrier inorganic layer is provided on at least one surface of the clay thin film substrate of the present invention where the clay thin film having a structure, in which oriented clay particles are laminated, it is possible to improve gas barrier properties and to suppress water vapor permeability. In addition, when a planarized inorganic layer is provided for the purpose of surface planarization and stress relaxation, the surface flatness of clay thin films together with the gas barrier properties are improved. Moreover, when an organic polymer layer is provided for the purpose of surface planarization, stress relaxation, and improvements in transparency, the surface smoothness of clay thin films is also similarly improved. Furthermore, the clay thin film substrate of the present invention has equivalent optical properties to those of the plastic substrates used as film substrates for displays. Moreover, the clay thin film substrate of the present invention is also excellent in terms of nonflamability and heat resistance compared to the plastic substrates. Accordingly, the clay thin film substrate of the present invention can be used favorably as a film substrate for liquid crystal and organic EL displays.

Furthermore, the clay thin film substrate of the present invention can be used for a large number of products due to its various properties. For example, it can be used as a substrate for an electronic paper, a sealing film for an electronic device, a lens film, a film for a light guide plate, a prism film, a film for a polarizing plate and a phase difference plate, a viewing angle correction film, a film for a plasma display panel (PDP), a film for a light emitting diode (LED), a member for optical communications, a film for a touch panel, a substrate for a film of various functionality, a film for electronics that is transparently configured and the inside of which can be seen through, a film for optical recording media including a video disc, discs such as CD, CD-R, CD-RW, DVD, MO, and MD, a phase change disc, an optical card, a sealing film for a fuel cell, a film for a solar cell, or the like.

DESCRIPTION OF THE REFERENCE SYMBOLS

11: Clay thin film; 12: Gas barrier inorganic layer; 13: Planarized inorganic layer; 14: Organic polymer layer; 21: Clay thin film substrate; 22: Transparent electrode layer; 23: Light emitting layer; 24: Cathode layer; 25a: Sealer; 25b: Sealer; 31 and 32: Clay thin film substrate with electrode; 31a and 32a: Clay thin film; 33 and 34: Transparent electrode layer; 35: Nematic liquid crystal; 36: Polarizing film; 37: Polarizing film; 38: Antireflection layer.

BEST MODES FOR CARRYING OUT THE INVENTION

Clay Thin Film Substrate

Figure 1:
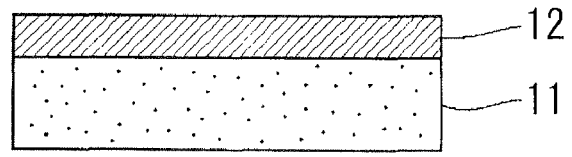
FIG. 1 is a schematic cross section of a clay thin film substrate of a first aspect of the present invention.
Figure 2:
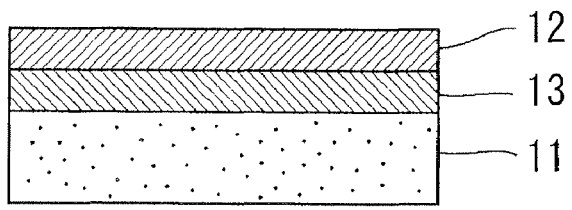
FIG. 2 is a schematic cross section of a clay thin film substrate of a second aspect of the present invention.
Figure 3:
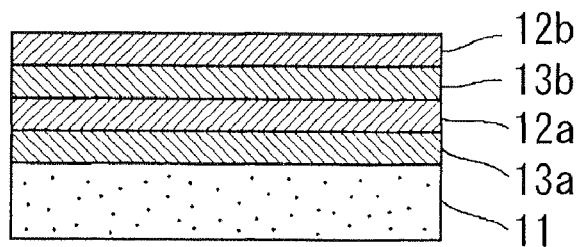
FIG. 3 is a schematic cross section of a clay thin film substrate of a third aspect of the present invention.
Figure 4:
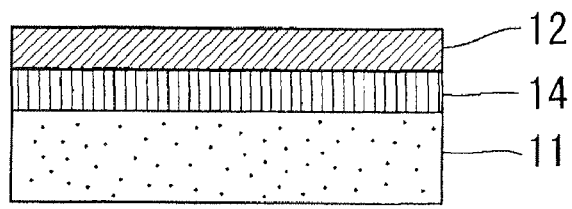
FIG. 4 is a schematic cross section of a clay thin film substrate of a fourth aspect of the present invention.
Figure 5:
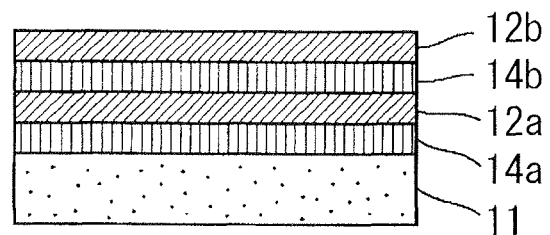
FIG. 5 is a schematic cross section of a clay thin film substrate of a fifth aspect of the present invention.

Firstly, the clay thin film substrate of the present invention will be described in detail. FIGS. 1 to 5 are schematic cross sections of the clay thin film substrates of the present invention. FIG. 1 shows a clay thin film substrate of a first aspect of the present invention in which a gas barrier inorganic layer 12 is laminated on one surface of a clay thin film 11, and FIG. 2 shows a clay thin film substrate of a second aspect of the present invention in which a planarized inorganic layer 13 and the gas barrier inorganic layer 12 are laminated on one surface of the clay thin film 11. FIG. 3 shows a clay thin film substrate of a third aspect of the present invention in which a plurality of planarized inorganic layers (two in the figure) 13a and 13b, and a plurality of gas barrier inorganic layers (two in the figure) 12a and 12b are laminated alternately on one surface of the clay thin film 11. FIG. 4 shows a clay thin film substrate of a fourth aspect of the present invention in which an organic polymer layer 14 and the gas barrier inorganic layer 12 are laminated on one surface of the clay thin film 11. FIG. 5 shows a clay thin film substrate of a fifth aspect of the present invention in which a plurality of organic polymer layers (two in the figure) 14a and 14b, and a plurality of gas barrier inorganic layers (two in the figure) 12a and 12b are laminated alternately on one surface of the clay thin film 11.

A clay thin film that is used for the clay thin film substrate of the present invention is a filmy material with a film thickness of 10 to 2000 μm and which has a structure where oriented clay particles are laminated. The clay thin film has clay as a major component whose content ranges from 70 to 100% of the total weight of the film, has excellent heat resistance as well as flexibility, and can be prepared by a known method. For example, the film can be obtained by the following method.

(1) Clay, alone or in combination with an additive, is dispersed in a dispersion medium, which is formed of water, an organic solvent, or a mixed solvent of water and organic solvent, in order to prepare a uniform clay dispersion.

(2) This dispersion is allowed to stand in order to deposit clay particles and to separate liquid components, which is a dispersion medium, by means of solid-liquid separation, and thereby forming a clay thin film.

(3) Furthermore, the resulting film is dried under a temperature condition of 110 to 300° C., where appropriate, to achieve a self contained film.

Examples of clay include natural clay or synthetic clay, and preferably, for example, at least one of mica, vermiculite, montmorillonite, iron montmorillonite, beidellite, saponite, hectorite, stevensite, and nontronite, and more preferably, either one of natural smectite and synthetic smectite, or a mixture thereof. Although the additives are not particularly limited, preferable examples thereof include epsilon-caprolactam, dextrin, starch, cellulose-based resins, gelatin, agar, wheat flour, gluten, alkyd resins, polyurethane resins, epoxy resins, fluororesins, acrylic resins, methacrylic resins, phenolic resins, polyamide resins, polyester resins, polyimide resins, polyvinyl resins, polyethylene glycol, polyacrylamide, polyethylene oxide, proteins, deoxyribonucleic acids, ribonucleic acids, polyamino acids, polyphenols, and benzoic acids.

Although the abovementioned clay dispersion may be an aqueous dispersion, it can also be used preferably as an organic solvent-based clay dispersion where clay is modified organically to make it hydrophobic and the organically modified clay is dispersed in an organic solvent. Examples of the methods to organically modify clay include a method to introduce an organically modifying agent between the layers of clay inorganics by ion exchange. For example, quaternary ammonium salts such as a dimethyldistearyl ammonium salt and a trimethylstearyl ammonium salt, ammonium salts having a benzyl group or a polyoxyethylene group, phosphonium salts, or imidazolium salts may be used as an organically modifying agent. Clay can be organically modified using its ion exchangeability, for example, cation exchangeability of montmorillonite. Due to this organic modification, the dispersion of clay in an organic solvent is easily achieved.

The thickness of the clay thin film can be controlled to any thickness by adjusting the solid-liquid ratio of the clay dispersion, conditions for depositing clay particles, or the like. However, the thickness of the clay thin film used for the clay thin film substrate of the present invention is in a range of 10 to 2000 µm. When the thickness is less than 10 µm, the film strength is reduced making it difficult to achieve a stable self contained film. On the other hand, when the thickness is more than 2000 µm, it will become difficult to bend the film, and thus the film does not exhibit satisfactory flexibility. The film thickness is particularly preferably in a range of 25 to 200 µm.

The clay thin film substrates of the present invention according to the first to third aspects are characterized by having at least one layer of the gas barrier inorganic layer or the gas barrier inorganic layer and the planarized inorganic layer being laminated on at least one surface of the abovementioned clay thin film. Although clay is a material excellent in heat resistance and gas barrier properties, its barrier performance rapidly declines under a highly humid atmosphere due to its swelling property. However, when a gas barrier inorganic layer is provided on the clay thin film, the swelling property is suppressed and a clay thin film substrate retaining high gas barrier properties even under high humidity conditions is achieved.

When a plastic substrate is used, a method has been reported in which a resin anchor coat layer (thermally crosslinkable resin) is provided between a gas barrier inorganic layer and a substrate for the purpose of improving flatness, relaxing stress, and avoiding the breakage of the gas barrier inorganic layer. However, clay cannot exhibit its heat resistance satisfactorily when a resin anchor coat layer is formed in the clay thin film. Accordingly, in the clay thin film substrate of the second aspect of the present invention, a planarized inorganic layer, which has a different function from that of the gas barrier inorganic layer and is provided for the purpose of surface planarization and stress relaxation, is provided between the gas barrier inorganic layer, which is for improving gas barrier properties, and the clay thin film. Due to this provision, a flexible clay thin film substrate of high performance can be provided without using an organic substance, which is vulnerable to heat. Although resin materials and silicon oxide materials have relatively low adhesion to each other, adhesion between materials made of silicon oxide is considerably high. Since both the gas barrier inorganic layer and the planarized inorganic layer have silicon oxide as major components in the present invention, there is an advantage in that adhesion between the two layers is extremely high which also contributes to the improvements in gas barrier properties. Moreover, whereas the production process of the prior art has been complex since the resin anchor coat layer is formed in the air while the gas barrier inorganic layer is formed in a vacuum, the gas barrier inorganic layer and the planarized inorganic layer are continuously formed and being laminated in a vacuum in the present invention. Therefore, the production can be carried out efficiently and clay thin film substrates can be obtained at a low cost in the present invention.

For the gas barrier inorganic layer, which is for the improvement in gas barrier properties, a high density are desired. Accordingly, it is preferable to use a sputtering method, for example, a magnetron sputtering method, as a film forming method, and use films formed of silicon oxide containing nitrogen or silicon nitride and which have a film thickness within the range of 10 to 200 nm as a constituent. The use of CVD or a vapor deposition method as a film forming method results in films with lower densities making it difficult to achieve satisfactory gas barrier properties. On the other hand, when the film thickness is 10 nm or less, satisfactory gas barrier properties are not achieved whereas film thicknesses of larger than 200 nm will generate cracks or the like resulting in reduced gas barrier performance.

The planarized inorganic layer, which is provided for the purpose of surface planarization and stress relaxation, is preferably one, which is formed by the use of the CVD method, formed of a silicon oxide film containing carbon, and has a film thickness within the range of 100 to 5000 nm. It is difficult to form a thick film without any cracks using a sputtering method, and thus difficult to achieve a film which functions as a stress relaxation layer. By using a silicon oxide containing carbon as a constituent of the planarized inorganic layer, films will have flexibility, and thus films suitable for stress relaxation can be obtained.

Although the gas barrier inorganic layer, which is for improving gas barrier properties, exhibits effective gas barrier properties even when provided on only one surface of the clay thin film, higher gas barrier properties under highly humid conditions can be achieved when it is provided on both surfaces. Moreover, by alternately laminating a plurality of the planarized inorganic layers, which are provided for the purpose of surface planarization and stress relaxation, and the gas barrier inorganic layers further improvements in these properties can be expected.

In order to use the clay thin film substrates for displays, transparency is also one of the important properties. Since the clay thin films have a relatively rough surface, the transparency which clay inorganic have originally cannot be present due to the diffuse reflection of light or the like. Accordingly, clay thin films have a disadvantage of being inferior compared to glass or resin films in terms of transparency, which is indispensable for use as a display. However, in the clay thin film substrates of the present invention, since the formation of a gas barrier inorganic layer or a gas barrier inorganic layer and a planarized inorganic layer also has an effect of planarizing the surface, there is also an advantage of being able to provide a clay substrate with a higher transparency. In order to further improve the transparency, it is desirable to form a clay thin film using synthetic clay inorganic that contain fewer impurities.

The clay thin film substrates according to the fourth and fifth aspects of the present invention are characterized by having at least one layer of the organic polymer layer and the gas barrier inorganic layer being laminated on at least one surface of the abovementioned clay thin film. However, the order of this lamination may be the one shown in FIG. 4 in the order of the clay thin film, the organic polymer layer, and the gas barrier inorganic layer, or it may be in the order of the clay thin film, the gas barrier inorganic layer, and the organic polymer layer. Moreover, the organic polymer layer and the gas barrier inorganic layer may be one layer or two or more layers. When the gas barrier inorganic layer and the organic polymer layer are provided on the clay thin film, the swelling property of clay is suppressed under a highly humid atmosphere and a clay thin film substrate retaining high gas barrier properties, especially high water vapor barrier properties, is achieved.

The organic polymer layer is required to have a high level of transparency and it can be formed by using, for example, acrylic resins, urethane resins, epoxy resins, polyester resins, olefin resins, fluorine resins, and silicone resins, or the like. The organic polymer layer is formed in order to improve surface planarization, stress relaxation, and transparency. The clay surface is highly uneven and it is difficult to fully cover the clay surface satisfactorily with the gas barrier inorganic layer by merely forming the gas barrier inorganic layer directly, and thus reductions in gas barrier properties due to film defects easily occur. By forming the organic polymer layer on the clay thin film, the film formation of the gas barrier inorganic layer can be carried out while the surface being planarized, and thus gas barrier properties improve. Moreover, since the surface is planarized, light scatter at the clay surface is suppressed and the haze dramatically improves. Furthermore, when the organic polymer layer is present at the surface, it relaxes the stress from the dense gas barrier inorganic layer, and thus a clay thin film substrate, which also has excellent flexibility, can be provided as a result.

As described earlier, clay thin films with high denseness are desired for the gas barrier inorganic layer, which is provided for improving gas barrier properties. Accordingly, it is preferable to use a sputtering method, for example, a magnetron sputtering method, as a film forming method, and examples of the constituent thereof include silicon oxide, silicon nitride, silicon carbide, aluminum oxide, aluminum nitride, and the complexes thereof. Among them, the films formed of silicon oxide containing nitrogen or silicon nitride films that have favorable gas barrier properties are particularly preferable. In addition, the film thickness of the gas barrier inorganic layer is preferably within the range of 10 to 200 nm. The use of a CVD or a vapor deposition method as a film forming method results in films with lower densities making it difficult to achieve satisfactory gas barrier properties. Additionally, when the film thickness is less than 10 nm, satisfactory gas barrier properties are difficult to achieve, whereas when the film thickness is larger than 200 nm cracks or the like are generated and gas barrier performance is easily reduced. Although the gas barrier inorganic layer presents effects of gas barrier properties even when provided only on one surface of the clay thin film, higher gas barrier properties under highly humid conditions can be achieved when it is provided on both surfaces. Moreover, by alternately laminating a plurality of the organic polymer layers, which are provided for the purpose of surface planarization and stress relaxation, and the gas barrier inorganic layers, further improvements in the properties can be expected.

(Clay Thin Film Substrate with Electrode)

It is possible to prepare a clay thin film substrate with an electrode for display devices by further laminating a transparent conductive layer on one surface of the either side of the clay thin film substrate of the present invention. Specifically, a transparent conductive layer is formed by the film-formation of a transparent conductive material having oxides, which contains at least one of indium, tin, and zinc, as a major component on the abovementioned clay thin film substrate using methods such as a CVD, a PVD, and a sol-gel method. As a result, clay thin film substrates with an electrode that have flexibility, high transparency, high gas barrier properties, flatness, heat resistance, and nonflamability can be provided to be used for displays represented by organic EL displays and LCDs.

In order to use the clay thin film substrate with an electrode of the present invention for displays, it is possible to form an anti-glare layer, an antireflection layer, and a hard coat layer on the surface of the clay thin film layer that is on opposite surface of where the transparent conductive layer is present. These layers may be provided alone or in a plurality of layers thereof may be laminated for provision.

The anti-glare layer is formed by containing a filler in a resin, which is generally used as a binder, preferably the resin constituting the following hard coat layer. Light is scattered or diffused by roughening the layer surface, and thereby anti-glare properties are achieved. Examples of the filler include inorganic fillers such as inorganic white pigments like silica, calcium carbonate, aluminum hydroxide, magnesium hydroxide, clay, talc, and titanium dioxide; and organic fillers such as organic transparent or white beads made of materials, such as an acrylic resin, a polystyrene resin, a polyethylene resin, an epoxy resin, and a silicone resin. In particular, an organic filler which is spherical and does not exhibit oil absorbing properties is preferable. By using spherical fillers, the part projecting from the surface of the anti-glare layer is moderated, making contaminants such as oil difficult to adhere thereto, and at the same time, making it easy to wipe off adhering contaminants.

The particle size D of the fillers according to JIS B9921 is preferably within the range of 0.5 $\mu m \leqq D \leqq 50$ $\mu m$. The amount of fillers to be loaded is preferably within the range of 0.5 to 30 weight % with respect to the total solid content of the anti-glare layer. When the loadings are 0.5 weight % or less, anti-reflection effects will be unsatisfactory. On the other hand, when 30 weight % or more of the filler is present, the transparency and the contrast of images are deteriorated, and the also durability, such as abrasion resistance and environmental resistance, is impaired.

The antireflection layer may be provided on the clay thin film substrate with a transparent electrode as: one layer of a low refractive index layer, which is formed from a material having a lower refractive index than the refractive index of the substrate; two layers configured by providing, on a high refractive index layer, a low refractive index layer that has lower refractive index than the high refractive index layer; or a lamination of two or more sets of the above two-layer configuration. The antireflection effect can be achieved by the above provision. Note that the terms "high refractive index" and "low refractive index" refer to the relative refractive index between the layers adjacent to each other.

The high refractive index layer is usually used as a binder. It can be formed by using, for example, resins such as acrylic resins, vinyl chloride resins, vinyl acetate resins, styrene resins, epoxy resins, polyester resins, and urethane resins; or those that contain, in these resins, a resin containing an aromatic ring or a halogen element such as Br, I, and Cl as a high refractive index material, or particles of an inorganic compound such as $TiO_2$, $CeO_2$, and $ZrO_2$.

The low refractive index layer can be formed from inorganic materials with low refractive index where particulated inorganic materials such as $SiO_2$, LiF, and $MgF_2$ are contained in an acrylic resin, an epoxy resin, or the like; or from organic materials with low refractive index such as fluorine-based and silicone-based organic compounds, thermoplastic resins, thermosetting resins, radiation-setting resins, or the like. The refractive index of this layer is preferably 1.45 or less. Among these materials, materials containing fluorine are particularly preferable from the viewpoint of contamination prevention. Note that, evaporated films or sputtering films made of inorganic materials can be used as the antireflection layer other than the organic materials.

The thickness required for the low refractive index layer to exhibit satisfactory antireflection effect can be calculated by a known formula. According to the known document (Science Library, Physics 9 "Optics", pp. 70 to 72), when incident light is vertically incident to the low refractive index layer, it is regarded that the conditions, for which the low refractive index layer does not reflect the light and also 100% of the light is transmitted, may be achieved by satisfying the following relational expressions (1) and (2). Note that in the expressions, N represents a refractive index of the low refractive index layer, Ns represents a refractive index of the high refractive index layer, h represents the thickness of the low refractive index layer, and λ represents a light wavelength. In reality, it is difficult to find materials that perfectly satisfy these mathematical expressions, and thus those materials and film thickness that are closest to satisfying the expressions are selected.

$$N=Ns^{1/2} \quad (1)$$

$$Nh=\lambda/4 \quad (2)$$

The term "hard coat layer" refers to a layer having a pencil hardness of H or more. Examples of resins that constitute the hard coat layer include those that cure due to either light, heat, or a combination thereof. As a photocurable resin, compositions in which monomers, oligomers, or prepolymers that have polymerizable unsaturated bonds such as an acryloyl group, a methacryloyl group, an acryloyloxy group, and a methacryloyloxy group, are appropriately mixed; epoxy-based compounds that cure due to ultraviolet radiation, or the like are used. Examples of the thermosetting resins include phenolic resins, furan resins, xylene-formaldehyde resins, ketone-formaldehyde resins, urea resins, melamine resins, aniline resins, alkyd resins, unsaturated polyester resins, and epoxy resins. These may be used alone or in combination of two or more kinds thereof.

Transparency of the curable resin used in the hard coat layer is preferably as high as possible and, in terms of light transmission, that of 80% or more is preferable and 90% or more is particularly preferable. Thickness of the hard coat layer is set within the range of 0.5 to 10 μm and preferably within the range of 1 to 5 μm. When the hard coat layer is thinner than 0.5 μm, abrasion resistance of the hard coat layer is impaired. On the other hand, when it is thicker than 10 μm, curls may be generated due to the shrinkage of resins upon curing, or microcracks may be generated in the hard coat layer.

(Display Device)

The display device of the present invention can be prepared by using the abovementioned clay thin film substrate or the abovementioned thin film substrate with an electrode. In other words, the display device can be prepared by forming a device, whose optical properties change due to the changes in electric voltage or electric current, on the abovementioned clay thin film substrates. In addition, an electroluminescence display device can be prepared by sequentially laminating a transparent electrode layer, a light emitting layer, and a cathode layer on the abovementioned clay thin film substrates. Furthermore, it is also possible to prepare a liquid crystal display device by sandwiching liquid crystal between the two transparent conducting oxide from two of the abovementioned clay thin film substrate with an electrode.

(Electroluminescence Display Device)

Next, the structure and the preparation method of the electroluminescence display device of the present invention will be described.

Figure 6:
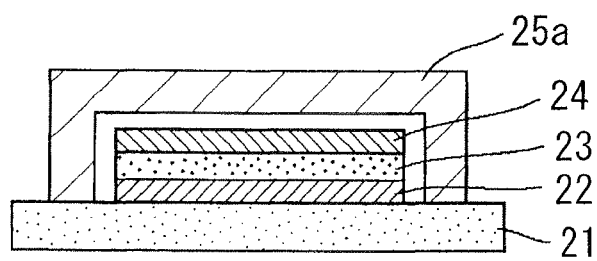
FIG. 6 is a schematic cross section of one example of an electroluminescence device of the present invention.
Figure 7:
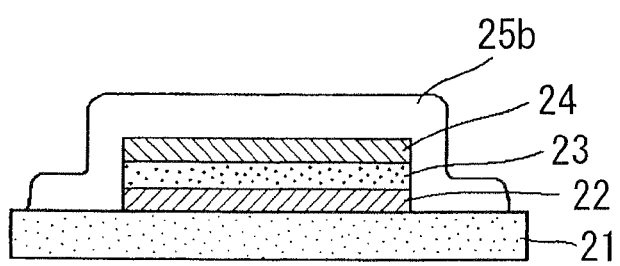
FIG. 7 is a schematic cross section of another example of an electroluminescence device of the present invention.

FIGS. 6 and 7 respectively show schematic cross sections of one example of an electroluminescence device of the present invention. In FIG. 6, the electroluminescence device has a structure in which a transparent electrode layer 22, a light emitting layer 23, and a cathode layer 24 are sequentially laminated on a clay thin film substrate 21, and this laminated body is sealed in a space enclosed by a sealer 25a, which is formed of metallic materials, plastic, or the like. In FIG. 7, the laminated body having an identical configuration to that shown in FIG. 6 is sealed by a sealer 25b, which is formed of resin materials such as a gas barrier film.

In the electroluminescence display device of the present invention, the clay thin film substrate of the present invention described above will be used as the clay thin film substrate 21.

The transparent electrode layer is one that functions as an anode supplying holes to the light emitting layer and, for example, conductive metal oxides such as tin oxide, zinc oxide, indium oxide, indium tin oxide (ITO), and indium zinc oxide (IZO), and metals such as gold, silver, and aluminum can be used. Its shape, structure, size, and the like is not particularly limited. A method for preparing the transparent electrode layer may be selected appropriately from the methods such as a vacuum vapor deposition method, a sputtering method, an ion plating method, a CVD method, and a plasma CVD method by taking the methods' compatibility with the abovementioned materials. Patterning of the transparent electrode layer can be carried out by a chemical etching method using photolithography, a physical etching method using a laser or the like, a vacuum vapor deposition method using a mask, a sputtering method, a lift-off method, a printing method, or the like. An appropriate range of the layer thickness is 10 nm to 5 μm.

The light emitting layer is one containing at least one type of light emitting materials, and where necessary, may contain a hole injecting material, a hole transporting material, an electron injecting material, an electron transporting material, or the like which facilitates generation and movement of holes and electrons. The hole injecting material, the hole transporting material, the electron injecting material, the electron transporting material, or the like may be contained in a layer separate from the light emitting layer to be laminated on the light emitting layer.

Examples of the light emitting materials include various metal complexes represented by metal complexes and rare earth complexes of benzoxazole derivatives, benzoimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perinone derivatives, oxadiazole derivatives, aldazine derivatives, pyrrolidine derivatives, cyclopentadiene derivatives, bisstyrylanthracene derivatives, quinacridone derivatives, pyrrolopyridine derivatives, thiadiazolopyridine derivatives, styrylamine derivatives, aromatic dimethylidene derivatives and 8-quinolyl derivatives; and polymer compounds such as polythiophene derivatives, polyphenylene derivatives, polyphenylene vinylene derivatives, and polyfluorene derivatives. These materials may be used alone or in combination of two or more kinds thereof.

As hole injecting materials and hole transporting materials, both the hole transporting materials of low molecular weight and the hole transporting materials of high molecular weight can be used, and they are not particularly limited as long as they have any one of the functions to inject holes from an anode, to transport holes, and to block electrons injected from a cathode. Examples of the hole transporting materials include conductive polymeric oligomers such as carbazole derivatives, triazole derivatives, oxazole derivatives, oxadiazole derivatives, imidazole derivatives, polyaryl alkane derivatives, pyrazoline derivatives, pyrazolone derivatives, phenylenediamine derivatives, arylamine derivatives, amino-substituted chalcone derivatives, styryl anthracene derivatives, fluorenone derivatives, hydrazone derivatives, stilbene derivatives, silazane derivatives, aromatic tertiary amine compounds, styrylamine compounds, aromatic dimethylidene-based compounds, porphyrin-based compounds, polysilane-based compounds, poly(N-vinylcarbazole) derivatives, aniline-based copolymers, thiophene oligomers, and polythiophenes, and polymer compounds such as polythiophene derivatives, polyphenylene derivatives, polyphenylenevinylene derivatives, and polyfluorene derivatives. These materials may be used alone or in combination of two or more kinds thereof.

As electron injecting materials and electron transporting materials, the materials are not particularly limited as long as they have any one of the functions to transport electrons and to block holes injected from an anode. Examples thereof include metal complexes of triazole derivatives, oxazole derivatives, oxadiazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, heterocyclic tetracarboxylic acid anhydrides such as naphthalene perylene, phthalocyanine derivatives, and 8-quinolinol derivatives, various metal complexes represented by those metal complexes having a ligand of metallophthalocyanine, benzoxazole, and benzothiazole, and polymer compounds such as aniline-based copolymers, thiophene oligomers, polythiophene derivatives, polyphenylene derivatives, polyphenylenevinylene derivatives, and polyfluorene derivatives. These materials may be used alone or in combination of two or more kinds thereof.

Formation of the light emitting layer can be favorably carried out by a variety of methods including dry processes such as a vapor deposition method and a sputtering method and wet processes such as a dipping method, a spin coating method, a dip coating method, a casting method, a die coating method, a roll coating method, a bar coating method, and a gravure coating method. It is possible to appropriately select from these film-forming methods depending on the materials of the light emitting layer. Film thickness of the light emitting layer is generally set within a range of 1 nm to 10 µm and preferably 10 nm to 1 µm. A hole injection layer, a hole transport layer, an electron injection layer, and an electron transport layer can also be prepared by the method similar to that for preparing the light emitting layer.

The cathode layer is not particularly limited in terms of its shape, structure, size, or the like as long as it functions as an electrode injecting electrons in the light emitting layer. Although its shape, structure, size, or the like is not particularly limited, its appropriate thickness is in the range of 10 nm to 5 µm. Examples of materials for the cathode layer include alkali metals (for example, Li, Na, K, Cs, or the like), alkaline earth metals (for example, Mg, Ca, or the like), gold, silver, lead, aluminum, sodium-potassium alloys, lithium-aluminum alloys, magnesium-silver alloys, indium, and rare earth metals such as ytterbium. Two or more kinds among these materials may be used in combination.

Methods such as vacuum vapor deposition, sputtering, ion plating, CVD, and plasma CVD can be used for forming the cathode layer and the method may appropriately be selected by taking the methods' compatibility with the cathode materials. For the cathode patterning, photolithography, physical etching using laser or the like, a vacuum vapor deposition method using a mask, a sputtering method, a lift-off method, a printing method, or the like can be adopted.

As a sealer, known sealers, such as sealers formed by metallic materials, plastic, or the like, for example, aluminum pipes, are used. However, the abovementioned clay thin film substrate in the present invention may also be used as a sealer.

(Liquid Crystal Display Device)

Next, the liquid crystal display device of the present invention will be described. Among the liquid crystal displays, other than those using TN liquid crystal and driven by a thin film transistor (TFT), ferroelectric liquid crystal (FLC) or anti-ferroelectric liquid crystal (AFLC) are used. Although these displays have different display principles and drive systems, they have a common structure, in which liquid crystal is sandwiched between substrates having one pair of electrodes. In the present invention, the clay thin film substrate described above is used as the substrate in these conventionally known liquid crystal displays.

Figure 8:
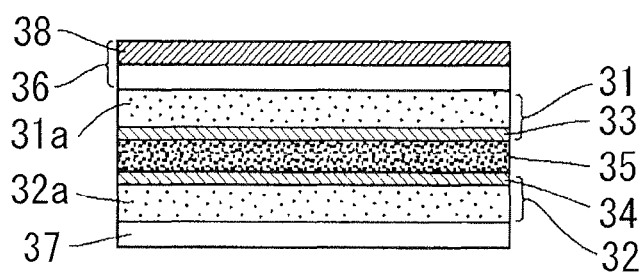
FIG. 8 is a schematic cross section of one example of a liquid crystal display device of the present invention where twisted nematic (TN) liquid crystal is used.

FIG. 8 is a schematic cross section of one example of a liquid crystal display device using TN liquid crystal. In this TN liquid crystal display device, two pieces of clay thin film substrates 31 and 32 are used in which the transparent electrode layers 33 and 34 having respective intended patterns are present on the clay thin films 31a and 32a, respectively. After forming a liquid crystal orientation film (not illustrated) on the clay thin film substrates by coating a polyimide solution and conducting a rubbing operation thereto, nematic liquid crystal 35 is injected between these clay thin film substrates and then the peripheral part of the clay thin film substrates is sealed with a resin or the like. The injected nematic liquid crystal 35 is twisted by 90° while being oriented due to the effect of the orientation film. A polarizing film 36, where an antireflection layer 38 having a surface layer and an anti-glare layer is provided, is laminated on one of the clay thin film substrate 31 on the side opposite to the transparent electrode layer. In addition, a polarizing film 37, which does not have an antireflection layer, is laminated on the other clay thin film substrate 32 on the side opposite to the transparent electrode layer so that the angles of polarization of the polarizing films 36 and 37 are different from each other by 90°, to configure a liquid crystal display panel. Note that conductive metal oxides such as tin oxide, zinc oxide, indium oxide, indium tin oxide (ITO), and indium zinc oxide (IZO) are used as an electrode material for the transparent electrode layer.

The best mode for carrying out the present invention will be described below based on Examples. However, the present invention is not limited to these Examples.

Example 1

(1) Production of Clay Thin Film

A clay thin film used as a base was produced by a known method. That is, synthetic smectite was added to distilled water and they were put into a sealed container made of plastic together with a rotor, and the resultant was shaken vigorously to obtain a uniform dispersion. Then, the dispersion was poured into a brass tray, which had a flat bottom face, and the clay dispersion was allowed to stand horizontally to slowly deposit clay particles, and also was dried in a forced draft oven while holding the tray horizontally. A clay thin film having a film thickness of 100 μm was obtained as a result.

(2) Production of Clay Thin Film Substrate

A gas barrier inorganic layer having silicon oxide as a major component was formed on both sides of the abovementioned clay thin film using a magnetron sputtering apparatus. In other words, the clay thin film was heated to 80° C. in a vacuum chamber and, after removing the residual water content, a gas barrier inorganic layer having a film thickness of 90 nm was formed on the clay thin film by the use of a reactive sputtering method where plasma due to the mixed gas of oxygen and nitrogen was generated close to the Si target. Composition analysis of the formed gas barrier inorganic layer was carried out by the X-ray photoelectron spectroscopy (ESCA) method. As a result, the composition of the gas barrier inorganic layer turned out to be 36.5 mol % of silicon, 43.2 mol % of oxygen, and 19.3 mol % of nitrogen, and thus verifying that it was a silicon oxide film containing nitrogen. In addition, by using a similar method, a silicon oxide film containing nitrogen having a film thickness of 90 nm and whose composition was 36.3 mol % of silicon, 42.9 mol % of oxygen, and 19.8 mol % of nitrogen was formed on the opposite side of the clay thin film, thereby achieving a clay thin film substrate having a gas barrier inorganic layer on both sides thereof.

(3) Property Evaluation of Clay Thin Film Substrate

Various properties of the clay thin film substrate obtained by the above-mentioned method were measured. As for its gas barrier performance, measurements of water vapor permeability (40° C./90% RH) and oxygen permeability (40° C./90% RH and 40° C./0% RH) were made by a differential gas chromatographic method according to JIS K 7126 A method (differential pressure method) using a gas/vapor permeability measuring apparatus (manufactured by GTR Tec Corporation) which was capable of measuring permeability/moisture permeability of gases, vapors, or the like. The water vapor permeability and oxygen permeability under the conditions of a temperature of 40° C. and a humidity of 90% were 0.003 g/m$^2$·day and 0.2 cc/m$^2$·day·atm, respectively.

The surface of the abovementioned clay thin film substrate was observed using an atomic force microscope (AFM) to measure the average surface roughness (Ra) (according to JIS B 0610-1994). The average surface roughness Ra was 25 nm before forming the silicon oxide film whereas it was 10 nm after the formation verifying that the surface planarization was achieved. This was accompanied by the reduction in haze from 6.5% to 3.0% measured by using a haze meter (Haze Meter NDH2000 manufactured by Nippon Denshoku Industries Co., Ltd.), and thus improvements in transparency were verified.

Example 2

After producing a clay thin film as in Example 1, a silicon oxide film (a planarized inorganic layer) was formed using a plasma CVD apparatus. In other words, a polymerization reaction was carried out in an oxygen plasma using hexamethyldisiloxane ($[(CH_3)_3Si]_2O$) as a monomer gas to form a silicon oxide film, which had a film thickness of 200 μm and contained carbon, on both sides of the clay thin film. The average surface roughness Ra was 25 nm before forming the silicon oxide film whereas it was 4 nm after the formation verifying that the surface planarization was achieved. Thereafter, a silicon oxide film (gas barrier inorganic layer), which had a film thickness of 90 nm and contained nitrogen, was formed thereon using the film formation method for gas barrier inorganic layers shown in Example 1 to obtain a clay thin film substrate.

The water vapor permeability of the clay thin film substrate obtained by the abovementioned method was, under a temperature of 40° C. and a humidity of 90%, equal to or below the measurement limit of $1 \times 10^{-5}$ g/m$^2$ day. The oxygen permeability thereof was 0.1 cc/m$^2$·day·atm or less. In addition, Ra was 2 nm and haze was 1.6% verifying that flatness and transparency were improved.

The following Table 1 shows a summary of the values of gas permeability, average surface roughness, total light transmission, and haze obtained for the clay thin film substrates of the present invention in Examples 1 and 2, and also for the clay thin film alone, in other words, the clay thin film which is not provided with a gas barrier inorganic layer, as a Comparative Example.

TABLE 1

|  |  |  |  | Clay thin film alone | Ex. 1 | Ex. 2 |
|---|---|---|---|---|---|---|
| Gas permeability | 40° C./90% RH |  | Water vapor permeability | g/m$^2$ · day | 6.5 | 0.003 | <1 × 10$^{-5}$ |
|  |  |  | Oxygen permeability | cc/m$^2$ · day · atm | 2.8 | 0.2 | <0.1 |
|  | 40° C./0% RH |  | Oxygen permeability | cc/m$^2$ · day · atm | <0.1 | <0.1 | <0.1 |
| Arithmetic mean surface roughness (Ra) in surface before formation of gas barrier inorganic layer |  |  |  | nm | 25 | 10 | 2 |
| Total light transmission |  |  |  | % | 92.3 | 90.2 | 90.8 |
| Haze |  |  |  | % | 6.5 | 3.0 | 1.6 |

As shown in Table 1, it is apparent that the gas barrier performance under high humidity improves by forming a gas barrier inorganic layer, which has silicon oxide as its main component, on the surface of the clay thin film substrate. In Example 2, the barrier performance is further improved by the provision of a planarized inorganic layer, which has silicon oxide as its main component, as an intermediate layer between the gas barrier layer and the clay film. It is assumed that this improvement is due to the planarization of surface unevenness of the clay thin film by the planarized inorganic layer resulting in the formation of gas barrier inorganic layer with few defects on the planarized inorganic layer.

(Flame Resistance Test)

Using a Bunsen Burner, which was Fueled with Methane Gas Having a Heat capacity of about 38 MJ/m$^3$, a pipe diameter of 9.5 mm, and a pipe length of 100 mm, the flame was adjusted to a blue flame of 19 mm length. Flame resistance test was carried out by holding a sample, which had a length of 125 mm and a width of 13 mm, vertically in the longitudinal direction thereof with a clamp so that the interval between the bottom of the sample and the top of the burner was 9.5 mm, and then bringing the flame into contact with the center of the bottom surface of the sample for 10 seconds. Although the film substrate, where a gas barrier inorganic layer was provided on a polyethylene terephthalate film, ignited upon contact, ignition was not observed in the clay thin film substrates of the present invention in Examples 1 and 2. Accordingly, it was verified that the clay thin film substrates of the present invention have excellent nonflamability.

Example 3

(1) Production of Clay Thin Film

A clay thin film having a film thickness of 100 μm was obtained as in Example 1.

(2) Production of Clay Thin Film Substrate (a) Formation of Organic Polymer Layer An acrylic, ultraviolet curable resin dissolved in a solvent was coated on the abovementioned clay thin film, and after vaporizing the solvent at 100° C. in a dryer, the resin was cured due to the polymerization using ultraviolet radiation to form an organic polymer layer having a thickness of 2 μm.

(b) Formation of Gas Barrier Inorganic Layer

A gas barrier inorganic layer having silicon oxide as a major component was formed on the abovementioned clay thin film, where the organic polymer layer was formed, using a magnetron sputtering apparatus. In other words, the clay thin film was heated to 80° C. in a vacuum chamber and, after removing the residual water content, a gas barrier inorganic layer having a film thickness of 90 nm was formed on the abovementioned thin film by the use of a reactive sputtering method where plasma due to the mixed gas of oxygen and nitrogen was generated close to the Si target, and thereby obtaining the clay thin film substrate of the present invention. Composition analysis of the formed gas barrier inorganic layer was carried out by the X-ray photoelectron spectroscopy (ESCA) method. As a result, the composition of the gas barrier inorganic layer turned out to be 36.5 mol % of silicon, 43.2 mol % of oxygen, and 19.3 mol % of nitrogen, and thus verified that it was a silicon oxide film containing nitrogen.

Example 4

The clay thin film substrate of the present invention was obtained by forming an organic polymer layer and a gas barrier inorganic layer as in Example 3 on the clay thin film surface of the clay thin film substrate obtained in Example 3.

Example 5

After forming an organic polymer layer and a gas barrier inorganic layer on the clay thin film as in Example 3, another set of an organic polymer layer and a gas barrier inorganic layer were further formed thereon using a similar method to obtain a clay thin film substrate of the present invention having a multiple layer configuration.

Example 6

A clay thin film substrate was obtained as in Example 3 by the film formation of a gas barrier inorganic layer but without the formation of an organic polymer layer.

(Property Evaluation of Clay Thin Film Substrate)

Measurements of water vapor permeability and oxygen permeability were made for the clay thin film substrates of the abovementioned Examples 3 to 6 as in Examples 1 and 2, and arithmetic mean surface roughness Ra, total light transmission, and haze were also measured in the surface before the formation of the gas barrier inorganic layer (i.e. the surface of the organic polymer layer). These results are shown in Table 2.

TABLE 2

| | | | | Ex. 3 | Ex. 4 | Ex. 5 | Ex. 6 |
|---|---|---|---|---|---|---|---|
| Gas permeability | 40° C./90% RH | Water vapor permeability | g/m$^2$ · day | <1 × 10$^{-5}$ | <1 × 10$^{-5}$ | <1 × 10$^{-5}$ | 0.003 |
| | | Oxygen permeability | cc/m$^2$ · day · atm | 0.15 | <0.1 | <0.1 | 0.2 |
| | 40° C./0% RH | Oxygen permeability | cc/m$^2$ · day · atm | <0.1 | <0.1 | <0.1 | <0.1 |
| Arithmetic mean surface roughness (Ra) in surface before formation of gas barrier inorganic layer | | | nm | 3.5 | 3.5 | 3.5 | 25 |
| Total light transmission | | | % | 88.4 | 86.8 | 86.9 | 87.5 |
| Haze | | | % | 1.0 | 0.8 | 0.8 | 4.5 |

As shown in the abovementioned Table 2, the clay thin film substrates of Examples 3 to 6 exhibited excellent gas barrier properties. In particular, in the clay thin film substrates of Examples 3 to 5 where the organic polymer layer was formed, the water vapor permeability at 40° C./90% RH and the oxygen permeability were 1×10$^{-5}$ g/m$^2$ day or less and 0.15 cc/m$^2$·day·atm or less, respectively, and thus they were excellent than the case of Example 6 where the organic polymer layer was not formed. This is due to the improvement in gas barrier performance of the gas barrier inorganic layer, resulting in the improvement in gas barrier performance of the clay thin films under high humidity, by the enhancement of the surface flatness of the clay thin films owing to the presence of the organic polymer layer, as is apparent from the Ra values in Table 2. Moreover, it was verified that the clay thin film substrates of Examples 3 to 6 had the total light transmission of 86% or more, and thus could be used satisfactorily for the display application. Furthermore, the haze values of the clay thin film substrates of Examples 3 to 5 were small, due to low surface roughness before the formation of the gas barrier inorganic layer, showing their excellent transparency, and thus verified that they were also excellent in terms of optical properties.

The invention claimed is:

1. A clay thin film substrate comprising:
    a clay thin film having a structure, in which oriented clay particles are laminated; and
    at least a gas barrier inorganic layer which is laminated on at least one surface of the clay thin film.

2. The clay thin film substrate according to claim 1 further comprising:
    a planarized inorganic layer which is laminated on at least one surface of the clay thin film having a structure, in which oriented clay particles are laminated, and
    a gas barrier inorganic layer which is laminated on the planarized inorganic layer.

3. The clay thin film substrate according to claim 1 further comprising a plurality of gas barrier inorganic layers and a plurality of planarized inorganic layers which are laminated alternately on at least one surface of the clay thin film having a structure, in which oriented clay particles are laminated.

4. The clay thin film substrate according to claim 1 further comprising an organic polymer layer and a gas barrier inorganic layer which are laminated on at least one surface of the clay thin film having a structure, in which oriented clay particles are laminated.

5. The clay thin film substrate according to claim 1 further comprising a plurality of organic polymer layers and a plurality of gas barrier inorganic layers which are laminated alternately on at least one surface of the clay thin film having a structure, in which oriented clay particles are laminated.

6. The clay thin film substrate according to any one of claims 1 to 5, wherein the gas barrier inorganic layer is formed of a silicon oxide film containing nitrogen or a silicon nitride film.

7. The clay thin film substrate according to any one of claims 1 to 5, wherein the gas barrier inorganic layer has a thickness of 10 to 200 nm.

8. The clay thin film substrate according to any one of claims 1 to 5, wherein the gas barrier inorganic layer is formed by a sputtering method.

9. The clay thin film substrate according to claim 2 or 3, wherein the planarized inorganic layer is formed of a silicon oxide film containing carbon.

10. The clay thin film substrate according to claim 2 or 3, wherein the planarized inorganic layer has a thickness of 100 to 5000 nm.

11. The clay thin film substrate according to claim 2 or 3, wherein the planarized inorganic layer is formed by a CVD method.

12. A clay thin film substrate with an electrode comprising:
    a clay thin film substrate including a clay thin film having a structure, in which oriented clay particles are laminated, and at least a gas barrier inorganic layer which is laminated on at least one surface of the clay thin film; and
    a transparent conductive layer which is laminated on any one of the surfaces of the clay thin film substrate.

13. The clay thin film substrate with an electrode according to claim 12 further comprising an anti-glare layer which is provided on a surface opposite to the surface where the transparent conductive layer is laminated.

14. The clay thin film substrate with an electrode according to claim 12 or 13 further comprising an anti-reflection layer which is provided on a surface opposite to the surface where the transparent conductive layer is laminated.

15. The clay thin film substrate with an electrode according to claim 12 or 13 further comprising a hard coat layer which is provided on a surface opposite to the surface where the transparent conductive layer is laminated.

16. An electroluminescence display device comprising:
    a laminated body where at least a transparent electrode layer, a light emitting layer, and a cathode layer are sequentially laminated on a substrate,
    wherein the substrate comprises of a clay thin film substrate including a clay thin film having a structure, in which oriented clay particles are laminated, and at least a gas barrier inorganic layer which is laminated on at least one surface of the clay thin film.

17. A liquid crystal display device comprising:
    liquid crystal sandwiched between two substrates, on which at least an electrode layer is laminated,
    wherein the substrate comprises of a clay thin film substrate including a clay thin film having a structure, in which oriented clay particles are laminated, and at least a gas barrier inorganic layer which is laminated on at least one surface of the clay thin film.

* * * * *